(12) United States Patent
Hsu et al.

(10) Patent No.: US 6,563,357 B1
(45) Date of Patent: May 13, 2003

(54) LEVEL CONVERTING LATCH

(75) Inventors: Steven K. Hsu, Lake Oswego, OR (US); Bhaskar P. Chatterjee, Waterloo (CA); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 10/027,905

(22) Filed: Dec. 20, 2001

(51) Int. Cl.[7] .............................................. H03K 3/356
(52) U.S. Cl. ...................... 327/212; 327/218; 327/333
(58) Field of Search ........................... 327/54, 55, 57, 327/199, 202, 203, 208, 210, 211, 212, 214, 215, 218, 219, 333, 225; 326/68, 80, 81

(56) References Cited

U.S. PATENT DOCUMENTS

| | | | |
|---|---|---|---|
| 4,996,453 A | 2/1991 | Zanders et al. ............... 326/81 |
| 5,382,838 A | 1/1995 | Sasaki et al. ............... 327/108 |
| 5,508,648 A | 4/1996 | Banik .......................... 327/203 |
| 5,751,174 A | 5/1998 | Kuo et al. ................... 327/199 |
| 5,767,716 A | 6/1998 | Ko ............................... 327/203 |
| 5,825,205 A | * 10/1998 | Ohtsuka ...................... 326/81 |
| 5,872,476 A | 2/1999 | Mihara et al. ............... 327/333 |
| 5,880,617 A | 3/1999 | Tanaka et al. ............... 327/333 |
| 5,929,687 A | 7/1999 | Yamauchi .................... 327/333 |
| 5,929,688 A | 7/1999 | Ueno et al. .................. 327/333 |
| 6,011,421 A | * 1/2000 | Jung ............................ 327/333 |
| 6,211,713 B1 | 4/2001 | Uhlmann ..................... 327/211 |
| 6,225,846 B1 | 5/2001 | Wada et al. ................. 327/215 |
| 6,456,136 B1 | * 9/2002 | Sutherland et al. ......... 327/225 |

OTHER PUBLICATIONS

Kawaguchi, H., et al., "A CMOS Scheme for 0.5V Supply Voltage with Pico–Ampere Standby Current", *ISSCC, IEEE 1998*, Slide Supplement, 154–155, 12.4.—1–12.4–4, (1998).

Kuroda, T., et al., "A 0.9–V, 150–MHz, 10–mW, 4 mm2, 2–D Discrete Cosine Transform Core Processor with Variable Threshold–Voltage (VT) Scheme", *IEEE Journal of Solid–State Circuits*, vol. 31, 1770–1779, (Nov. 1996).

Usami, K., et al., "Automated Low–Power Technique Exploiting Multiple Supply Voltages Applied to a Media Processor", *IEEE Journal of Solid–State Circuits*, vol. 33, 463–471, (Mar. 1998).

* cited by examiner

*Primary Examiner*—Tuan T. Lam
*Assistant Examiner*—Long Nguyen
(74) *Attorney, Agent, or Firm*—Schwegman, Lundberg, Woessner & Kluth, P.A.

(57) ABSTRACT

A level converting latch, using dual-supply voltage signals and operating with reduced charge contention, converts an input signal having a first and a second potential level into an output signal also having a first and a second potential level. The first potential level of the input and output signals are the same. The second potential level of the input and output signals are unequal.

26 Claims, 7 Drawing Sheets

LEVEL CONVERTING LATCH

FIELD

The present invention relates generally to latches, and more specifically to level converting latches in dual-supply voltage designs.

BACKGROUND

Latch circuits are widely used to temporarily store data and transfer the data from one part of a circuit to another part of the circuit. Integrated circuits such as microprocessors and memory devices often include a number of latch circuits and typically have a single supply voltage. However, because of demand for longer battery life in ultra low-power microprocessors and other circuits, designers have proposed a concept of dual-supply voltages. This concept allows critical units of the integrated circuits to operate at a higher supply voltage (Vcch) while non-critical units operate at a lower supply voltage (Vccl). When circuits operate at a lower voltage (Vccl), they operate slower but consume less power.

A problem arises when a unit operating at Vccl interfaces with a unit operating at Vcch. To solve this problem, level converting latches have been suggested. FIG. 1 shows a prior art level converting latch 100. Latch 100 receives a low swing signal or "Vccl signal," Din, and outputs a high swing signal or "Vcch signal," Dout. A Vccl signal has high potential level corresponding to Vccl; a Vcch signal has a high potential level corresponding to Vcch, which is greater than Vccl. Both Vccl and Vcch have the same low potential level, e.g., zero or ground. Latch 100 includes internal nodes A and B. Transistors N1 and N2 connect to nodes A and B and to transistor N3 and inverter I1 to allow node A or B to discharge to ground, in response to a potential level of a clock signal CLK. Cross-coupled inverters I2 and I3 connect to node A and B to operate as a conversion and a feedback circuit.

When the CLK signal switches from zero to Vcch, transistor N3 turns on. Depending on the level of the Din signal, either node A or B selectively discharges to ground through transistors N1 and N3 or N2 and N3. Inverters I2 and I3 convert the Vccl Din signal to a Vcch signal and hold it as potential levels at nodes A and B. Inverter I4 drives the Vcch signal to an output of the latch as the Dout signal. As long as the CLK signal is at Vcch, latch 100 is transparent and the Vccl Din signal is available at an output of latch 100 as the Vcch Dout signal.

When the CLK signal switches from Vcch to zero, transistor N3 turns off, stopping the effect of the Din signal on nodes A and B. However, inverters I2 and I3 hold nodes A and B at the previous potential level of the Din signal until the CLK signal switches to Vcch.

A problem arises when node A or B discharges to ground but nodes A or B hold an opposite potential level from the previous cycle. For example, when the CLK signal switches from zero to Vcch, transistor N3 turns on and node A discharges to ground. However, if node A holds the Vcch potential, discharging to ground would cause a charge contention, leading to poor performance.

Further, since node A or B discharges to ground through a number of transistors, either N1 and N3 or N2 and N3, latch 100 may introduce unnecessary delay between the Din signal and the Dout signal.

For the reasons stated above, and for other reasons stated below which will become apparent to those skilled in the art upon reading and understanding the present specification, there is a need for an improved level converting latch.

DESCRIPTION OF EMBODIMENTS

Figure 1:
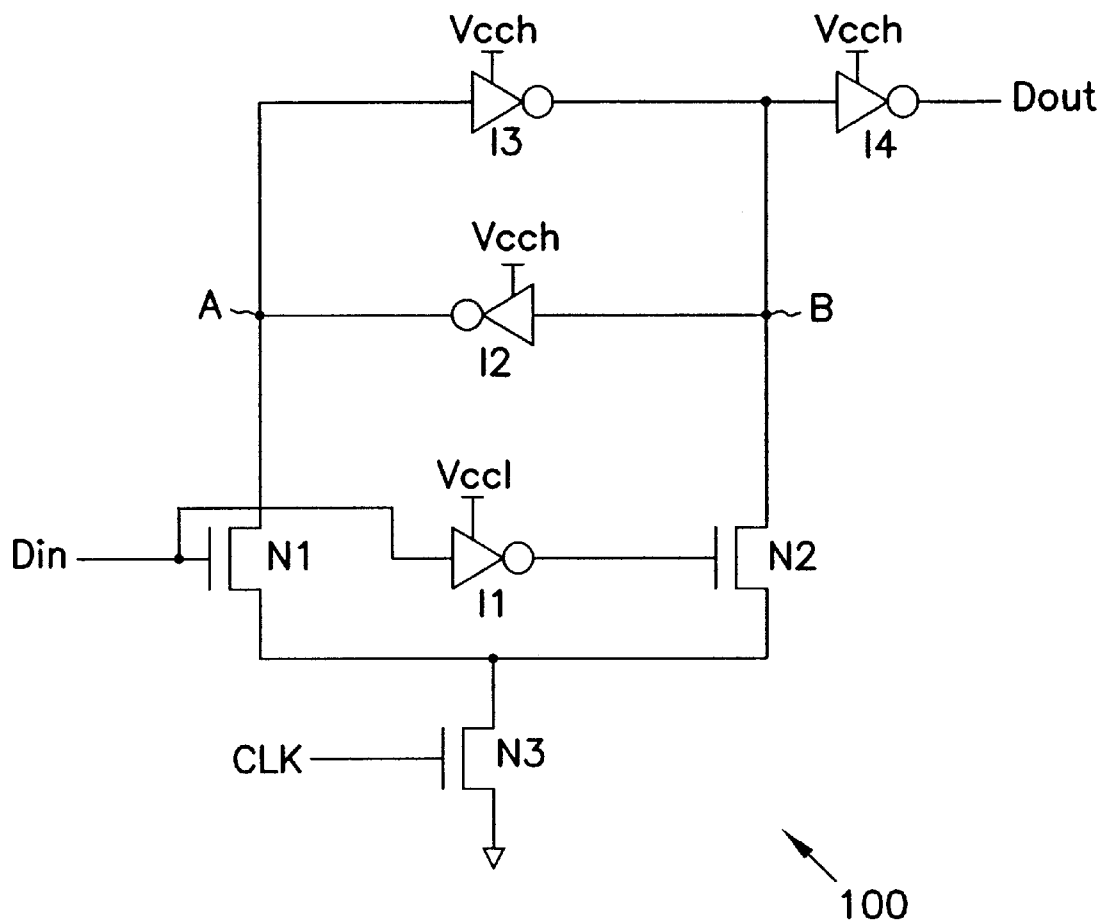
FIG. 1 shows a prior art level converting latch.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, the various embodiments of the invention, although different, are not necessarily mutually exclusive. For example, a particular feature, structure, or characteristic described in one embodiment may be included within other embodiments. Therefore, the following detailed description is not to be taken in a limiting sense, and the scope of the present invention is defined only by the appended claims, along with the full scope of equivalents to which such claims are entitled.

Figure 2:
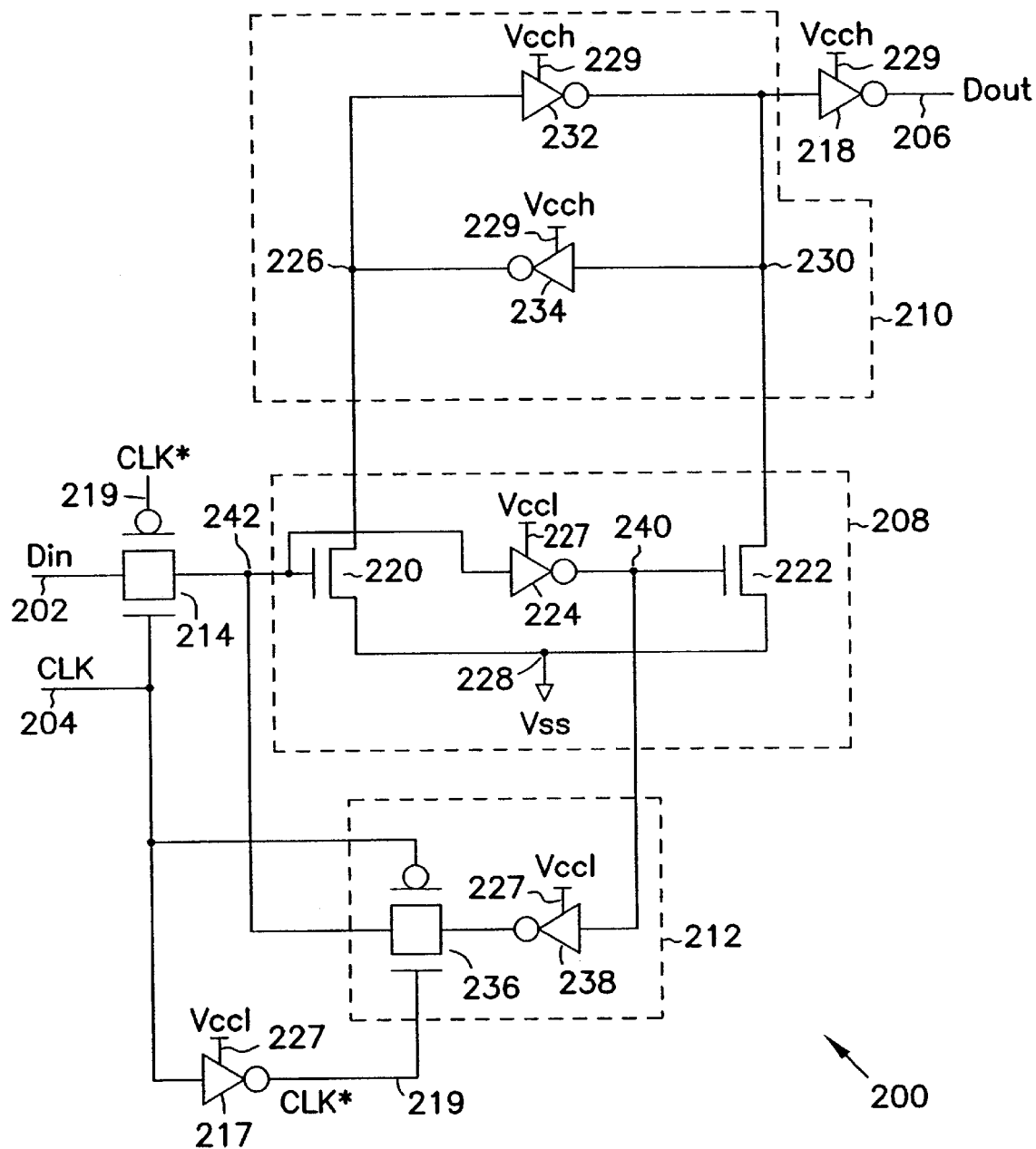
FIG. 2 shows a level converting latch.

FIG. 2 shows a level converting latch 200. Latch 200 includes a latch-in node 202 to receive an input data signal Din, a clock input node 204 to receive a clock signal CLK, and a latch-out node 206 to output an output data signal Dout. In embodiments represented by FIG. 2, the Dout signal is an inverse version of the Din signal. Latch 200 also includes an input circuit 208, a level conversion circuit 210, an input feedback loop 212, an input transmission gate 214, inverters 217 and 218, a first supply node 227, and a second supply node 229.

First supply node 227 receives a first supply voltage Vccl. Second supply node 229 receives a second supply voltage Vcch. In embodiments represented by FIG. 2, supply voltages Vccl and Vcch are unequal. Vccl and Vcch refer to dual-supply voltages and can be provided by any supply voltage source inside or outside latch 200.

Input circuit 208 includes input switches 220 and 222, and an input inverter 224. In embodiments represented by FIG. 2, switches 220 and 222 are represented by transistors 220 and 222. However, other types of switches can be used without departing from the scope of the invention. Transistor 220 has a gate connected to transmission gate 214, and a drain and a source connected between a first internal node 226 and a reference node 228. Transistor 222 has a drain and a source connected between a second internal node 230 and reference node 228. Inverter 224 connects between a gate of transistor 220 at an input node 242 and a gate of transistor 222 at node 240. Reference node 228 has a reference potential level indicated by Vss.

In embodiments represented by FIG. 2, transistors 220 and 222 are n-channel metal oxide semiconductor field effect transistors (NMOSFETs), also referred to as "NFETs"

or "NMOS." An NMOS transistor turns on to conduct current between its source and drain when its gate is at a high potential level, and turns off when its gate is at a low potential level. Other types of transistors can also be used. For example, embodiments exist that utilize bipolar junction transistors (BJTs) and junction field effect transistors (JFETs). One of ordinary skill in the art will understand that many other types of transistors can be utilized without departing from the scope of the present invention.

Conversion circuit 210 includes inverters 232 and 234 cross-coupled to each other such that an input of one inverter connects to the output of the other inverter. Cross-coupled inverters 232 and 234 connect to internal nodes 226 and 230. Inverter 218 connects between conversion circuit 210 and node 206 to serve as a buffer. In some embodiments, inverter 218 is omitted.

Input feedback loop 212 includes a feedback transmission gate 236 and a feedback inverter 238 which form a loop between node 240 of input circuit 208 and node 242. Transmission gate 236 is controlled by the CLK signal and a CLK* signal. The CLK* signal is a complement or an inverse version of the CLK signal. In some embodiments, inverter 217 generates the CLK* signal at its output at node 219. In some embodiments, the CLK* signal is generated outside latch 200 and inverter 217 is omitted. The CLK and CLK* signal also control transmission gate 214.

Inverters 218, 232, and 234 connect to supply node 229 to receive the supply voltage Vcch. Inverters 217, 224, and 238 connect to supply node 227 to receive the supply voltage Vccl. In embodiments represented by FIG. 2, inverter 217 connects to supply node 227, and the CLK signal switches between either Vss and Vccl or Vss and Vcch. In other embodiments, inverter 217 connects to supply node 229 instead of supply node 227, and the CLK signal switches between Vss to Vcch. Supply voltage Vcch is greater than supply voltage Vccl. The Din signal is a Vccl signal and the Dout signal is a Vcch signal.

In embodiments represented by FIG. 2, a data path is formed from node 202 to node 206. The data path includes an input data path and an output data path. Elements of the input data path include nodes 202, 242, and 240, transmission gate 214, inverter 224, and transistors 220 and 222. Elements of the output data path include nodes 226, 230, and 206, and inverters 218, 232, and 234. A clock path is formed from node 204 to the gates of transmission gates 214 and 236. The clock path further includes inverter 217 and node 219.

Various embodiments of the circuits are described with reference to a Vccl signal and a Vcch signal. The Vccl signal has a reference potential level and a high potential level. The reference potential level corresponds to Vss; the high potential level corresponds to Vccl, in which Vccl is greater than Vss. Similarly, the Vcch signal has a reference potential level and a high potential level. The high potential level of the Vcch signal corresponds to Vcch, in which Vcch is greater than Vccl. The reference potential levels Vss of both Vccl and Vcch are the same: In the various embodiments of the circuits, Vss is zero or ground and Vccl and Vcch are not zero (not ground). However, in other embodiments, Vss can be at different values.

Figure 3:
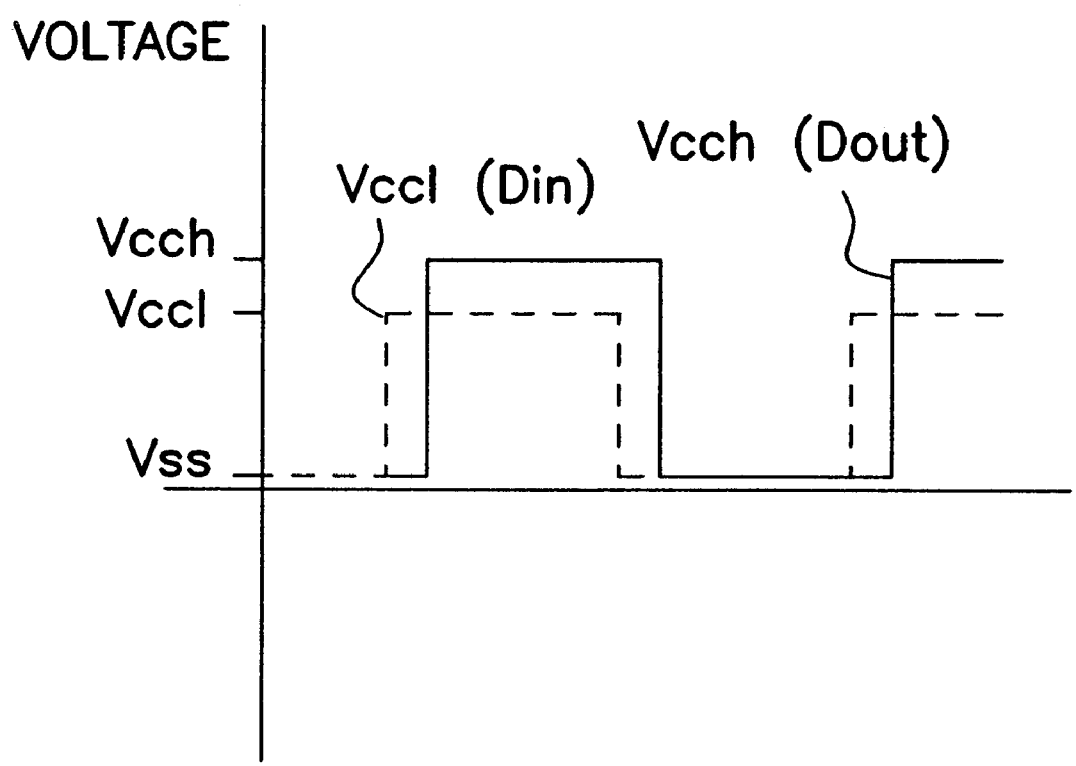
FIG. 3 shows an example of a Vccl and a Vcch signal.

FIG. 3 shows an example of a Vccl signal and a Vcch signal. In the Figure, the Vccl signal is indicated by the dashed line and the Vcch signal is indicated by the solid line. In some embodiments, the Vccl signal represents the Din signal and the Vcch signal represents the Dout signal of FIG. 2. As shown in FIG. 3, the Din signal switches between the Vccl level and the reference potential level Vss. The Dout signal switches between the Vcch level and the reference potential level. The levels of the Vccl and Vcch in relation to the reference potential level are not necessarily drawn to scale.

Referring again to FIG. 2, when the CLK signal switches from Vss to Vccl, transmission gate 236 turns off, cutting off the feedback loop from node 240 to node 242. Transmission gate 214 turns on to pass the Din signal from node 202 to node 242. Depending on the signal level of the Din signal, either transistor 220 or transistor 222 turns on. For example, if the Din signal is at Vss, node 242 will be at Vss and node 240 will be at Vccl. Transistor 220 will turn off and transistor 222 will turn on. In the opposite case, if the Din signal is at Vccl, node 242 will be at Vccl and node 240 will be at Vss. Transistor 220 will turn on and transistor 222 will turn off.

When transistor 220 turns on, node 226 discharges to Vss at node 228. When transistor 222 turns on, node 230 discharges to Vss at node 228. In either case, cross-coupled inverters 232 and 234 perform a level conversion and an output feedback function at the same time. Cross-coupled inverters 232 and 234 perform the output feedback function to retain the potential levels at nodes 226 and 230, and the level conversion function to convert the potential level of the Din signal. Since both inverters 232 and 234 connect to Vcch, they selectively convert the potential level of the Din signal into opposite potential levels of Vcch and Vss and retain the opposite potential levels at nodes 226 and 230.

For example, if transistor 220 turns on, node 226 discharges to Vss; in this case, cross-coupled inverters 232 and 234 hold node 226 at Vss and node 230 at Vcch. If transistor 222 turns on, node 230 discharges to Vss; in this case, cross-coupled inverters 232 and 234 hold node 226 at Vcch and node 230 at Vss. Inverter 218 receives the potential level on node 230 and produces the Dout signal at node 206.

When the CLK signal switches from Vccl to Vss, transmission gate 214 turns off, stopping the transmission of the Din signal from node 202 to node 242. However, transmission gate 236 turns on to pass the previous potential level of the Din signal at the output of inverter 238 back to node 242. Therefore, node 242 retains the potential level of the Din signal even when the CLK signal switches to Vss. Consequently, cross-coupled inverters 232 and 234 also retain the potential levels at nodes 226 and 230. The Dout signal at node 206 remains at the same level until the CLK signal switches to Vccl and the Din signal at node 242 changes value.

In embodiments represented by FIG. 2, node 226 or 230 discharges to node 228 through either transistor 220 or transistor 222. Thus, a discharge path from node 226 or node 230 to node 228 includes only one transistor. This reduces the delay time of the output data path from node 202 to node 206. Further, since input feedback loop 212 holds the potential level of the Din signal at node 242 even when the CLK signal switches to Vss, a contention at node 242 is also reduced.

Figure 4:
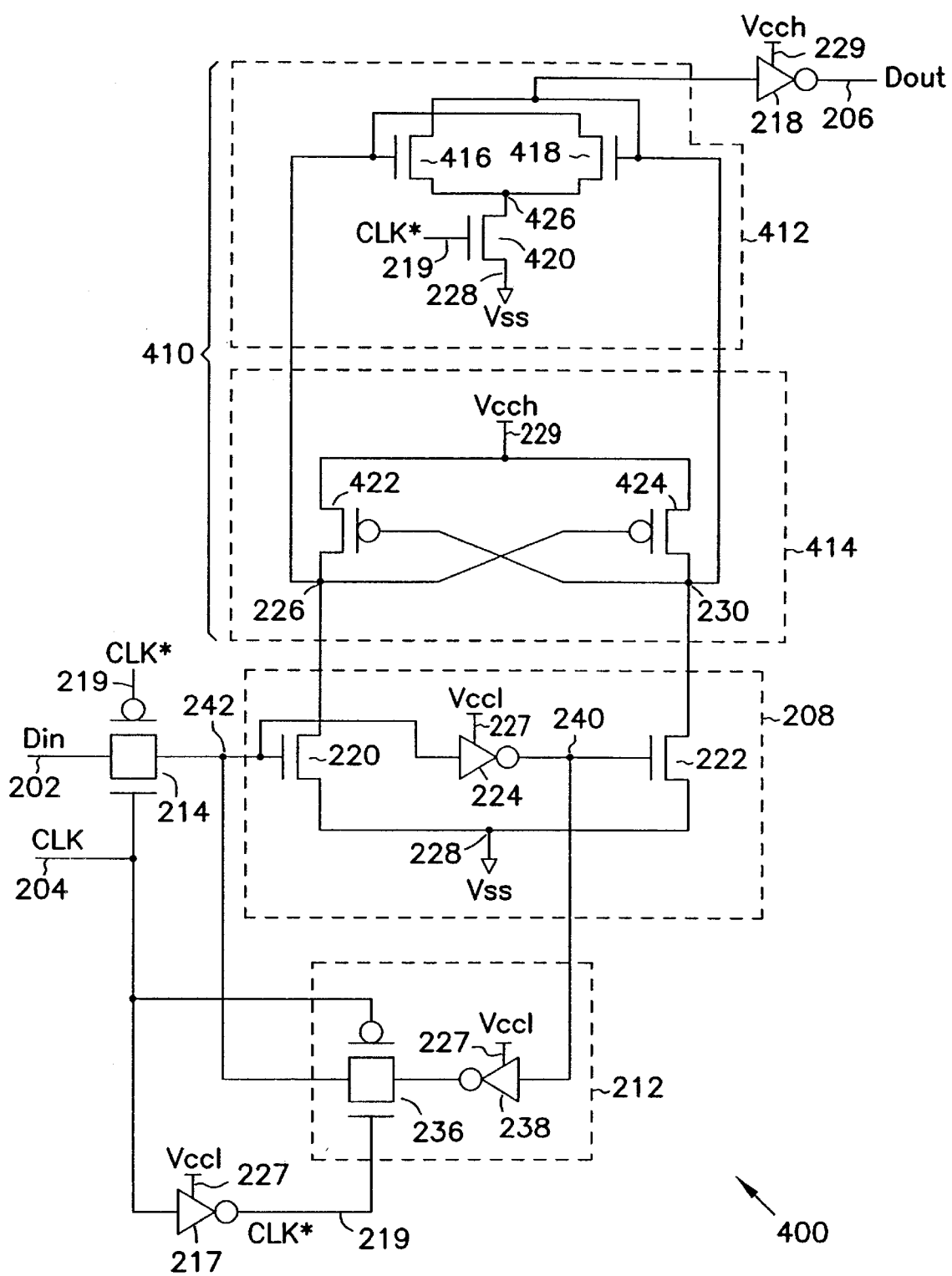
FIG. 4 shows another level converting latch.

FIG. 4 shows a level converting latch 400. Latch 400 is the same as latch 200 except conversion circuit 410. In FIG. 2, latch 200 performs both output feedback and level conversion functions at the same time using cross-coupled inverters 232 and 234. In FIG. 4, latch 400 performs the output feedback and level conversion function separately by separate circuit portions, an output feedback portion 412 and a converting portion 414.

Output feedback portion 412 includes feedback switches 416, 418 and 420. In embodiments represented by FIG. 4, feedback switches 416, 418, and 420 are represented by transistors 416, 418, and 420. However, in other types of switches can be used without departing from the scope of the invention. Converting portion 414 includes transistors 422 and 424. Transistors 416 and 418 have their sources connected together at a common node 426. A drain of transistor 416 connects to node 230 and a gate of transistor 418. A drain of transistor 418 connects to node 226 and a gate of transistor 416. Transistor 420 has a drain and a source connected between node 426 and reference node 228. A gate of transistor 420 connects to node 219 to receive the CLK* signal. Output feedback portion 412 and input feedback loop 212 form a feedback network.

Transistors 422 and 424 cross-couple to each other such that their sources connect together, a drain of transistor 422 connects to a gate of transistor 424, and a drain of transistor 424 connects to a gate of transistor 422. The gate of transistor 422 connects to node 230. The gate of transistor 424 connects to node 226. Cross-coupled transistors 422 and 424 connect to supply node 229 at their sources to receive the supply voltage Vcch.

In embodiments represented by FIG. 4, transistors 416, 418, and 420 are the same type as transistors 220 and 222. Transistors 422 and 424 are p-channel metal oxide semiconductor field effect transistors (PMOSFETs), also referred to as "PFETs" or "PMOS." A PMOS transistor turns on to conduct current between its source and drain when its gate is at a low potential level, and turns off when its gate is at a high potential level. Other types of transistors can also be used. For example, embodiments exist that utilize bipolar junction transistors (BJTs) and junction field effect transistors (JFETs). One of ordinary skill in the art will understand that many other types of transistors can be utilized without departing from the scope of the present invention.

Embodiments represented by FIG. 4 include data and clock paths that are similar to the data and clock paths of embodiments represented by FIG. 2. In FIG. 4, however, the clock path also includes the gate of transistor 420.

The operation of latch 400 is similar to the operation of latch 200 of FIG. 2. However, latch 400 of FIG. 4 further reduces the contention at nodes 226 and 230 when the Din signal at node 242 changes and the CLK signal is at Vccl level.

When the CLK signal is at Vccl and the CLK* signal is at Vss, nodes 226 and 230 are not affected by the output feedback portion 412 because transistor 420 turns off. When transistor 420 turns off, it acts as an isolation device to isolate output feedback portion 412 from node 226 or 230. This cuts off the flow of current from nodes 226 or 230 through output feedback portion 412 to node 228. Therefore, when cross-coupled transistors 422 and 424 selectively convert the potential levels at nodes 226 and 230 to Vss and Vcch, the contention is reduced.

When the CLK signal switches to Vss and the CLK* signal switches to Vccl, transistor 420 turns on. When transistor 420 is on, either transistor 416 or transistor 418 turns on and holds node 226 or 230 to Vss. As a result, nodes 226 and 230 retain their potential levels through transistors 416, 418, 420, 422, and 424. Since inverter 218 receives the potential level at node 230 to produce the Dout signal, the Dout signal also retains its potential level when the CLK signal is at Vss and the CLK* signal is at Vccl. As described in the embodiments represented by FIG. 2, when the CLK signal is at Vss and the CLK* signal is at Vccl, transmission gate 236 turns on to pass the previous potential level of the Din signal at the output of inverter 238 back to node 242.

Therefore, node 242 retains the potential level of the Din signal when the CLK signal is at Vss. Thus, the feedback network, formed by output feedback portion 412 and input feedback loop 212, retains the potential levels of the Din and Dout signals when the CLK signal is at Vss and the CLK* signal is at Vccl.

Transistor 416 or 418 turns on depending on potential levels of nodes 226 and 230. For example, if node 226 is at Vcch and node 230 is at Vss, when the CLK* signal switches to Vccl, transistor 420 turns on. Since node 226 is at Vcch, transistor 416 turns on and holds node 230 at Vss. When node 230 is at Vss, transistor 422 turns on and pulls node 226 to Vcch. Thus, nodes 226 and 230 retain their potential levels. If node 226 is at Vss and node 230 is at Vcch, when the CLK* signal switches to Vccl, transistor 420 turns on. In this case, since node 230 is at Vcch, transistor 418 turns on and holds node 226 at Vss. When node 226 is at Vss, transistor 424 turns on and pulls node 230 to Vcch. Thus, nodes 226 and 230 retain their potential levels in this case. In the example, when the CLK signal switches to Vss and the CLK* signal switches to Vccl, either transistor 416 or 418 turns on to enable nodes 226 and 230 to retain their potential levels.

Figure 5:
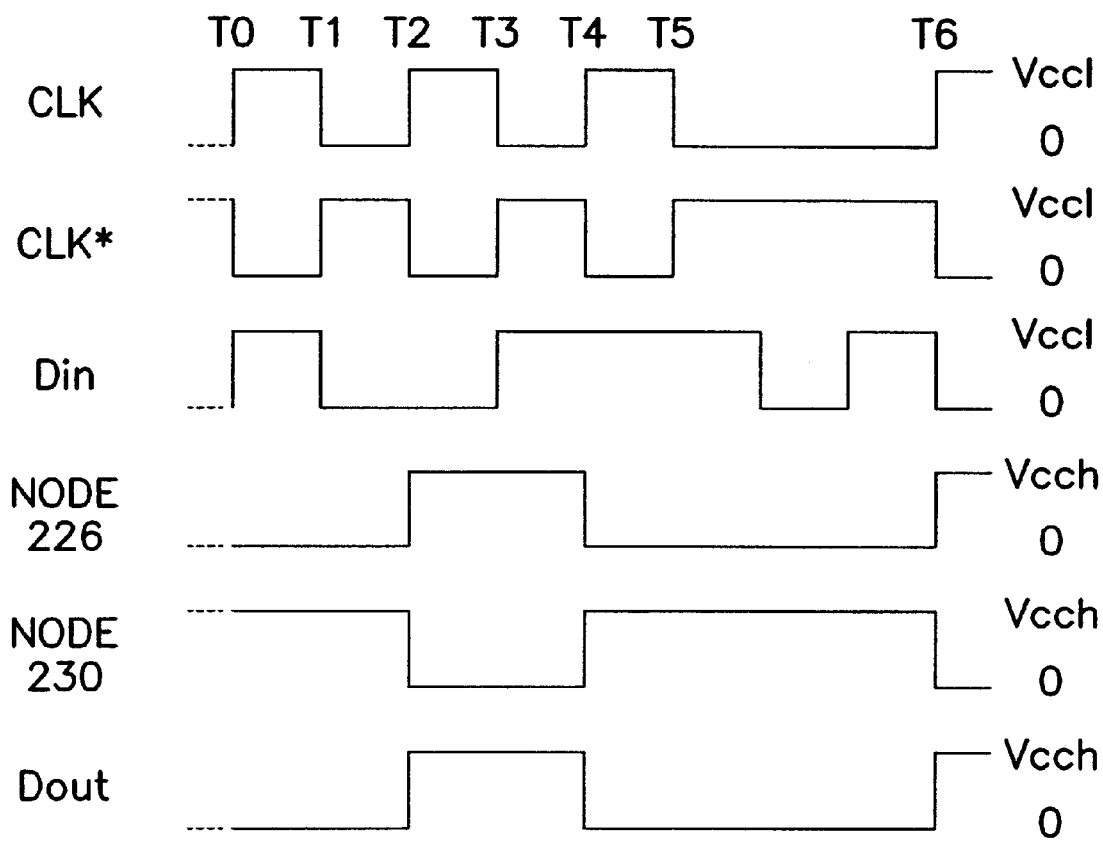
FIG. 5 is a timing diagram.

FIG. 5 is a timing diagram of latch 200 and latch 400. As shown in the figure, the CLK, CLK* and Din signals switch between Vss and Vccl potential levels. The signals at nodes 226, 230 and Dout switch between Vss and Vcch potential levels. As described in the embodiments of FIGS. 2 and 4, nodes 226 and 230 have opposite potentials levels. FIG. 5 shows these opposite potential levels of nodes 226 and 230 between time T0 and T6. Also as described with reference to the embodiments of FIGS. 2 and 4, when the CLK signal is at Vccl and the Din signal is at Vccl, node 226 is at Vss. FIG. 5 shows that between times T0–T1, and T4–T5 node 226 is at Vss. When the CLK signal is at Vccl and the Din signal is at Vss, node 226 is at Vcch. FIG. 5 shows that between times T2–T3 node 226 is at Vcch. Between times T1–T2, and T3–T4, node 226 retains its previous potential levels because the CLK signal is at Vss. Node 230 behaves in a similar but opposite manner from node 226. Therefore, node 230 has opposite potential levels from node 226. Between times T5–T6, nodes 226 and 230 retain the opposite potential levels regardless of changes in the Din signal because the CLK signal is at Vss.

In the embodiments of FIG. 2 and FIG. 4, latch 200 and latch 400 convert a Vccl input signal into a Vcch output signal. In other embodiments, however, latch 200 and 400 can also perform the opposite, i.e., converting a Vcch signal into a Vccl signal. For example, latch 200 can convert a Vcch signal into a Vccl signal by connecting inverters 218, 232, and 234 into Vccl, and inverter 224 to Vcch. Latch 400 can convert a Vcch signal into a Vccl signal by connecting inverter 218 to Vccl, and inverter 224 and cross-coupled transistors 422 and 424 to Vcch.

Figure 6:
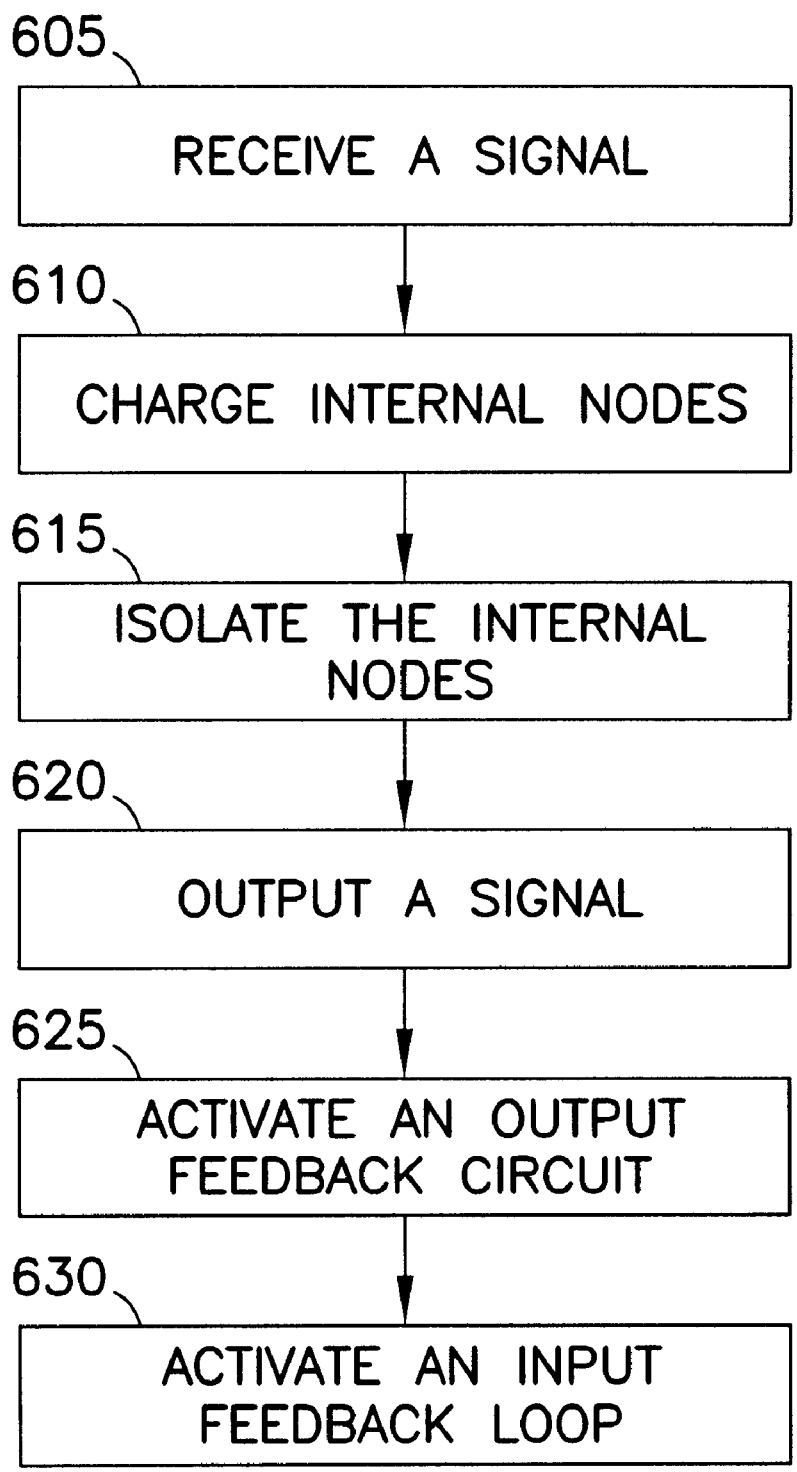
FIG. 6 is a flowchart of a method.

FIG. 6 is a flowchart of a method of operating on a signal. Method 600 receives an input signal having a reference potential level and a high potential level and outputs an output signal having a reference potential level and a high potential level. The reference potential levels of the input and output signals are the same. The high potential levels of the input and output signals are unequal.

Box 605 receives the input signal. Box 610 charges a first and a second internal node to potential levels that are equal to the reference potential level and the high potential level of the output data in response to a first potential level of a clock signal.

Box 615 isolates the first and second internal nodes from an output feedback circuit during the first potential level of the clock signal. In some embodiments, box 615 stops a flow of current from the first and second internal nodes through the output feedback circuit to a reference node.

Box 620 outputs the output signal.

Box 625 activates the output feedback circuit to hold the first and second internal nodes at the same potential levels in response to a second potential level of the clock signal. In some embodiments, box 625 turns on a transistor that connects the first and second internal nodes to the reference node. In other embodiments, the reference node has a ground potential.

Box 630 activates an input feedback loop to maintain the potential level of the input signal at an input node in response to the second potential level of the clock signal. In one embodiment, box 630 turns on a transmission gate that connects the input feedback path to an input node.

Figure 7:
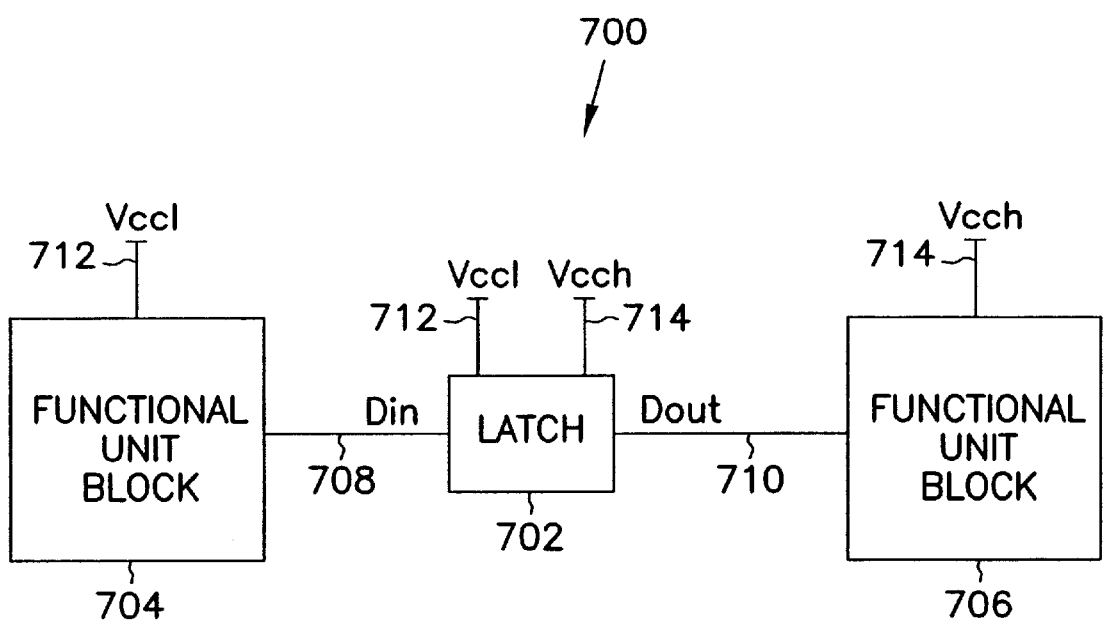
FIG. 7 shows an integrated circuit.

FIG. 7 shows an integrated circuit (IC) 700. IC 700 includes a latch 702, a first functional unit block (FUB) 704, and a second FUB 706. Latch 702 connects to FUB 704 via line 708 to receive an input signal Din, and connects to FUB 706 via line 710 to output an output signal Dout.

FUB 704 connects to a supply node 712. FUB 706 connects to a supply node 714. Latch 702 also connects to nodes 712 and 714. In embodiments represented by FIG. 7, node 712 connects to a supply voltage Vccl and node 714 connects to a supply voltage Vcch, in which Vcch and Vccl are not equal. In one embodiment, Vcch is greater than Vccl.

Latch 702 is similar to latch 200 of FIG. 2 or latch 400 of FIG. 4. The operation of latch 702 is also similar to the operation of latch 200 or latch 400. In operation, FUB 704 generates the Din signal on node 708. The Din signal is a Vccl signal, which is similar to the Din signal represented by embodiments of FIGS. 2, 3, and 4. Latch 702 receives the Din signal and converts it to the Vcch Dout signal in a similar fashion as latch 200 or latch 400. The Dout signal feeds into FUB 706 for further processing.

In embodiments represented by FIG. 7, IC 700 can be any type of integrated circuit. For example, IC 700 can be a processor such as a microprocessor, a digital signal processor, a microcontroller, or the like. IC 700 can also be an integrated circuit other than a processor such as an application-specific integrated circuit, a communications device, a memory controller, or a memory device such as a dynamic random access memory device.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed:

1. A latch comprising:
   an input circuit including a first and a second input switch connected together at a reference node, the input circuit including a first supply node to receive a first supply voltage;
   a conversion circuit connected to the first input switch at a first internal node and to the second input switch at a second internal node, the conversion circuit including a second supply node to receive a second supply voltage different from the first supply voltage; and
   an input feedback loop including an inverter and a feedback transmission gate connected in series with each other and in between the first and second input switches.

2. The latch of claim 1 further comprising:
   an input node connected to the input circuit;
   a latch-in node to receive a data signal; and an input transmission gate connected between the latch-in node and the input node.

3. The latch of claim 2, wherein the input circuit further includes an input inverter connected between a gate of the first input switch and a gate of the second input switch.

4. The latch of claim 3, wherein the conversion circuit includes a pair of cross-coupled inverters connected between the first internal node and the second internal node.

5. The latch of claim 3, wherein the conversion circuit includes:
   a pair of cross-coupled transistors connected between the second supply node and the first and second internal nodes;
   a first transistor having a drain and a source connected between the first internal node and a common node;
   a second feedback transistor having a drain and a source connected between the second internal node and the common node; and
   a third transistor connected between the common node and the reference node.

6. The latch of claim 5 further comprising a clock input node to receive a clock signal, the clock input node being connected to the input transmission gate and the feedback transmission gate.

7. The latch of claim 6 further comprising:
   a latch-out node to produce an output signal; and an output buffer connected in between the latch-out node and one of the first and second internal nodes.

8. The latch of claim 7, wherein each of the input and output signals includes a first and a second potential level, wherein the first potential levels of the input and output signals are the same and the second potential levels of the input and output signals are unequal.

9. A latch comprising:
   a first input transistor connected between a first internal node and a reference node;
   a second input transistor connected between a second internal node and the reference node, and an input inverter connected between a gate of the first input transistor and a gate of the second input transistor;
   a level converting circuit connected between a supply node and the first and second internal nodes;
   an output feedback circuit including a first feedback transistor connected between the first internal node and a common node, a second feedback transistor connected between the second internal node and the common node, and a third feedback transistor connected between the common node and the reference node; and
   an input feedback loop connected between the first and second input transistors.

10. The latch of claim 9 further comprising:
    a latch-in node to receive a data signal; and
    an input transmission gate connected between the latch-in node and the gate of one of the first and second input transistors.

11. The latch of claim 10, wherein the level converting circuit includes:
    a first transistor having a drain and a source connected between the supply node and the first internal node, and a gate connected to the second internal node; and
    a second transistor having a drain and a source connected between the supply node and the second internal node, and a gate connected to the first internal node.

12. The latch of claim 11, wherein the input feedback loop includes:
   a feedback inverter having an input connected to an output of the input inverter; and
   a feedback transmission gate connected between an input of the input inverter and an output of the feedback inverter.

13. The latch of claim 12 further comprising a clock input node to receive a clock signal, the clock input node being connected to the input transmission gate and the feedback transmission gate.

14. The latch of claim 13 further comprising:
   a latch-out node to produce an output-signal; and
   an output buffer connected in between the latch-out node and one of the internal nodes.

15. The latch of claim 14, wherein each of the input and output signals includes a first and a second potential level, wherein the first potential levels of the input and output signals are the same and the second potential levels of the input and output signals are unequal.

16. An integrated circuit comprising:
   a first functional unit to output a first data signal; and
   a latch connected to the first functional unit, the latch including:
      a clock path to receive a clock signal;
      an input data path to receive the first data signal, the input data path being connected to a first supply node, the input data path including a first and a second transistor connected between a reference node and a first and a second internal node;
      a level converting circuit connected between a second supply node and the first and second internal nodes;
      an output data path to output a second data signal, the output data path being connected to one of the first and second internal nodes;
      an input feedback loop having a transmission gate and an inverter connected in series with each other and in between a gate of the first transistor and a gate of the second transistor; and
an output feedback circuit including a first feedback transistor connected between the first internal node and a common node, a second feedback transistor connected between the second internal node and the common node, and a third feedback transistor connected between the common node the reference node.

17. The integrated circuit of claim 16, wherein the input data path further includes an inverter connected between the first and second transistors, the inverter further being connected to the first supply node to receive a first supply voltage, the first supply voltage being unequal to a second voltage received at the second supply node.

18. The integrated circuit of claim 17, wherein the level converting circuit includes a pair of cross-coupled transistors.

19. The integrated circuit of claim 17 further comprising a second functional unit connected to the latch to receive the second data signal, the second functional unit including a supply node to receive the second supply voltage.

20. The integrated circuit of claim 17, wherein each of the first and second signals includes a first and a second potential level, wherein the first potential levels of the first and second signals are the same and the second potential levels of the first and second signals are unequal.

21. The integrated circuit of claim 20 further comprising a processor.

22. A method of operating on a signal, the method comprising:
   receiving an input signal having a reference potential level and a first potential level;
   charging first and second internal nodes to the reference potential level and a second potential level in response to a first potential level of a clock signal, wherein the first potential level of the input signal and the second potential level are unequal;
   isolating the first and second internal nodes from an output feedback circuit during the first potential level of the clock signal;
   activating the output feedback circuit to retain the reference potential level and the second potential level at the first and second internal nodes in response to a second potential level of the clock signal; and activating an input feedback loop to retain a potential level of the input signal at an input node in response to the second potential level of the clock signal.

23. The method of claim 22, wherein isolating the first and second internal nodes includes stopping a flow of current from the first and second internal nodes through the output feedback circuit.

24. The method of claim 23, wherein activating the output feedback circuit includes turning on a transistor connecting the output feedback path to a reference node.

25. The method of claim 23, wherein activating an input feedback loop includes turning on a transmission gate connecting the input feedback path to an input node.

26. The method of claim 22 further comprising:
   outputting an output signal having the reference potential level and the second potential level.

* * * * *